United States Patent
Choi et al.

(10) Patent No.: US 10,068,828 B2
(45) Date of Patent: Sep. 4, 2018

(54) SEMICONDUCTOR STORAGE DEVICES

(71) Applicant: SAMSUNG ELECTRONICS CO., LTD., Suwon-si, Gyeonggi-do (KR)

(72) Inventors: Min-Young Choi, Hwaseong-si (KR); Young-Rok Oh, Seoul (KR); Hwi-Jong Yoo, Seoul (KR); Il-Soo Kim, Hwaseong-si (KR); Joo-Young Kim, Suwon-si (KR); Ki-Taek Lee, Hwaseong-si (KR); Eun-Ji Yu, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/478,252

(22) Filed: Apr. 4, 2017

(65) Prior Publication Data

US 2018/0158752 A1 Jun. 7, 2018

(30) Foreign Application Priority Data

Dec. 7, 2016 (KR) .................. 10-2016-0166210

(51) Int. Cl.
*H01L 23/02* (2006.01)
*H01L 23/367* (2006.01)
(Continued)

(52) U.S. Cl.
CPC .... *H01L 23/3677* (2013.01); *H01L 23/49822* (2013.01); *H01L 23/49838* (2013.01);
(Continued)

(58) Field of Classification Search
CPC ........... H01L 23/3677; H01L 23/49822; H01L 23/49827; H01L 23/49855; H01L 23/49838; H01L 25/0655
(Continued)

(56) References Cited

U.S. PATENT DOCUMENTS 5,212,466 A * 5/1993 Yamada ............... H01C 1/1406
  338/22 R
5,640,048 A * 6/1997 Selna ................... H01L 23/3128
  257/659

(Continued)

FOREIGN PATENT DOCUMENTS

JP 05-326779 A 12/1993

OTHER PUBLICATIONS

Tallis, Bill, "Samsung Announces 960 PRO and 960 EVO M.2 PCIe SSDs (Updated)" Sep. 21, 2016.

*Primary Examiner* — Nitin Parekh
(74) *Attorney, Agent, or Firm* — Volentine, Whitt & Francos, PLLC

(57) ABSTRACT

A semiconductor storage device includes a circuit substrate. The circuit substrate includes a main body and a connection tab connected to a side of the main body. The a main body includes a first chip mounting region and a second chip mounting region. A first semiconductor chip of a first type is mounted on the first chip mounting region. A second semiconductor chip of a second type is mounted on the second chip mounting region. The first type of the first semiconductor chip is different from the second type of the second semiconductor chip. The circuit substrate further includes a first thermal via in the connection tab and comprising a conductive material.

20 Claims, 10 Drawing Sheets

(51) Int. Cl.
   *H01L 23/00* (2006.01)
   *H01L 23/498* (2006.01)
   *H01L 25/065* (2006.01)

(52) U.S. Cl.
   CPC .......... *H01L 24/50* (2013.01); *H01L 25/0655* (2013.01); *H01L 2224/50* (2013.01)

(58) Field of Classification Search
   USPC ................................................ 257/701, 723
   See application file for complete search history.

(56) References Cited

U.S. PATENT DOCUMENTS

| | | | |
|---|---|---|---|
| 5,751,553 A * | 5/1998 | Clayton | H01L 23/13 174/254 |
| 5,982,630 A | 11/1999 | Bhatia | |
| 6,452,804 B1 | 9/2002 | Dibene, II et al. | |
| 6,532,157 B1 * | 3/2003 | Glenn | H01L 31/0203 174/255 |
| 6,721,189 B1 * | 4/2004 | Haba | H05K 1/147 174/254 |
| 6,875,962 B2 | 4/2005 | Uhl et al. | |
| 7,485,006 B2 | 2/2009 | Park et al. | |
| 7,652,359 B2 * | 1/2010 | Takayama | G06K 19/077 235/380 |
| 8,779,575 B2 * | 7/2014 | Shinohara | H01L 23/49531 257/666 |
| 9,437,518 B2 | 9/2016 | Byun et al. | |
| 2001/0008309 A1 * | 7/2001 | Iijima | H01L 21/76885 257/737 |
| 2001/0026009 A1 * | 10/2001 | Tsunesa | H01L 23/49811 257/673 |
| 2001/0035575 A1 * | 11/2001 | Miyazaki | H01L 23/49816 257/690 |
| 2004/0056344 A1 * | 3/2004 | Ogawa | H01L 21/6835 257/686 |
| 2004/0169285 A1 * | 9/2004 | Verma | G06K 19/072 257/777 |
| 2009/0283886 A1 * | 11/2009 | Yamazaki | G06K 19/0704 257/679 |
| 2010/0214742 A1 | 8/2010 | Lin et al. | |
| 2011/0133315 A1 * | 6/2011 | Pahl | B81B 7/0048 257/659 |
| 2015/0342090 A1 | 11/2015 | Yang et al. | |
| 2016/0064837 A1 | 3/2016 | Yu et al. | |

* cited by examiner

US 10,068,828 B2

SEMICONDUCTOR STORAGE DEVICES

CROSS-REFERENCE TO RELATED APPLICATION

This application claims priority under 35 U.S.C. § 119 to Korean Patent Application No. 10-2016-0166210, filed on Dec. 7, 2016 in the Korean Intellectual Property Office, the disclosure of which is hereby incorporated by reference in its entirety.

BACKGROUND

1. Technical Field

Example embodiments of the present disclosure relate to semiconductor storage devices, and more specifically, to semiconductor storage devices such as solid state drives.

2. Discussion of Related Art

Solid state drives include non-volatile memory devices such as flash memories. Electronic systems such as computer systems have started using solid state drives. The solid state drives are gradually replacing conventional hard disk drives/magnetic disks. Solid state drives are data storage devices that use solid state memory to store persistent data. Solid state drives can often include NAND flash non-volatile memory. Solid state drives have been preferred as data storage devices due to fast access speed, high integration and stability against an external impact. As electronic systems become smaller, development of solid state drives having a compact size and improved reliability is demanded.

SUMMARY

According to example embodiments of the inventive concepts, a semiconductor storage device may include a circuit substrate that includes a main body and a connection tab connected to a side of the main body. The main body may include a first chip mounting region and a second chip mounting region. A first semiconductor chip of a first type may be mounted on the first chip mounting region, and a second semiconductor chip of a second type may be mounted on the second chip mounting region. The second type of the second semiconductor chip may be different from the first type of the first semiconductor chip. The circuit substrate may further include a first thermal via in the connection tab and comprising a conductive material.

According to example embodiments of the inventive concepts, a semiconductor storage device may include a circuit substrate that includes a main body and a connection tab connected to a side of the main body. A controller may be provided on the main body, and a memory device may be provided on the main body. The memory device may be further away from the connection tab than the controller. The circuit substrate may further include a first thermal via in the connection tab and a second thermal via in a portion of the main body overlapping the controller.

According to example embodiments of the inventive concepts, a semiconductor storage device may include a connection tab that includes a first thermal via comprising a conductive material, and a main body connected to the connection tab. The main body may include a first chip mounting region and a second chip mounting region. The first thermal via may be configured to dissipate heat from a first semiconductor chip of a first type mounted on the first chip mounting region of the main body. The first thermal via may be configured to channel heat from the first semiconductor chip away from a second semiconductor chip of a second type mounted on the second chip mounting region.

DETAILED DESCRIPTION OF THE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
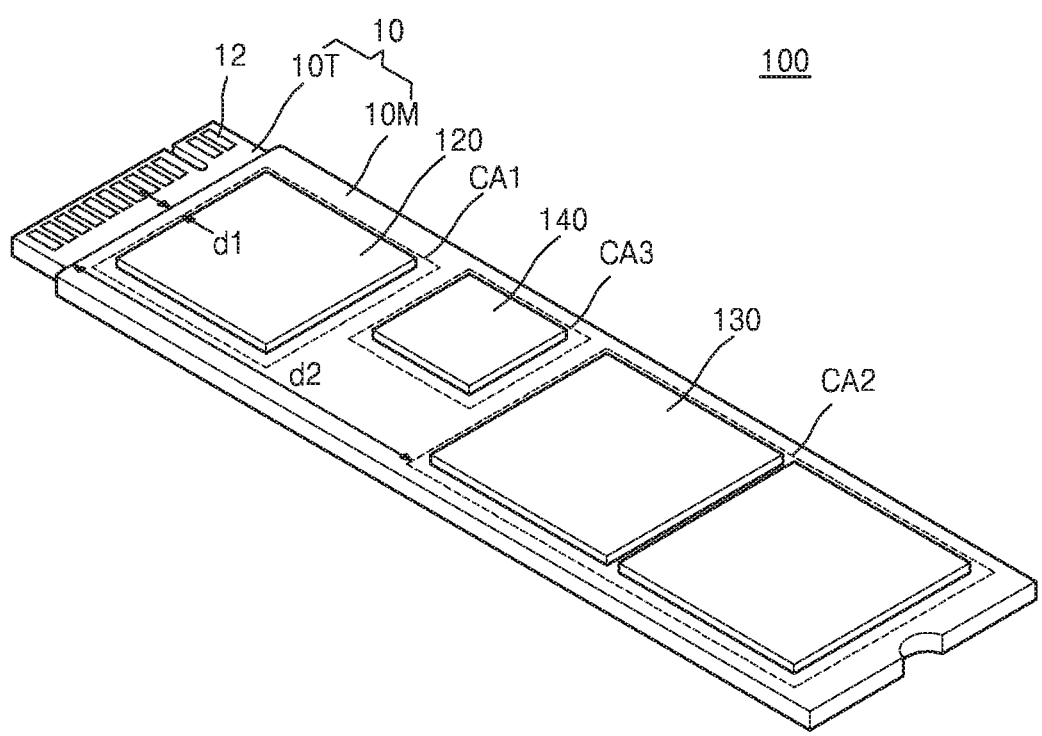
FIG. 1 is a perspective view illustrating a semiconductor storage device according to example embodiments.
Figure 2:
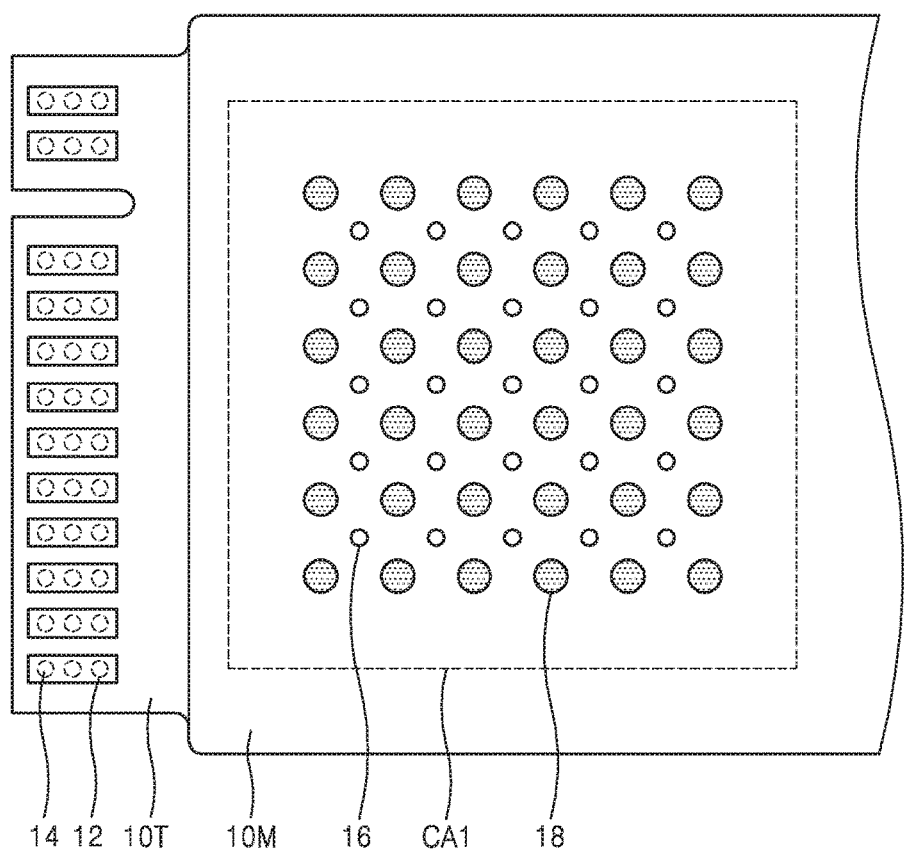
FIG. 2 is an enlarged layout diagram illustrating a portion of a circuit substrate of FIG. 1 according to example embodiments.
Figure 3:
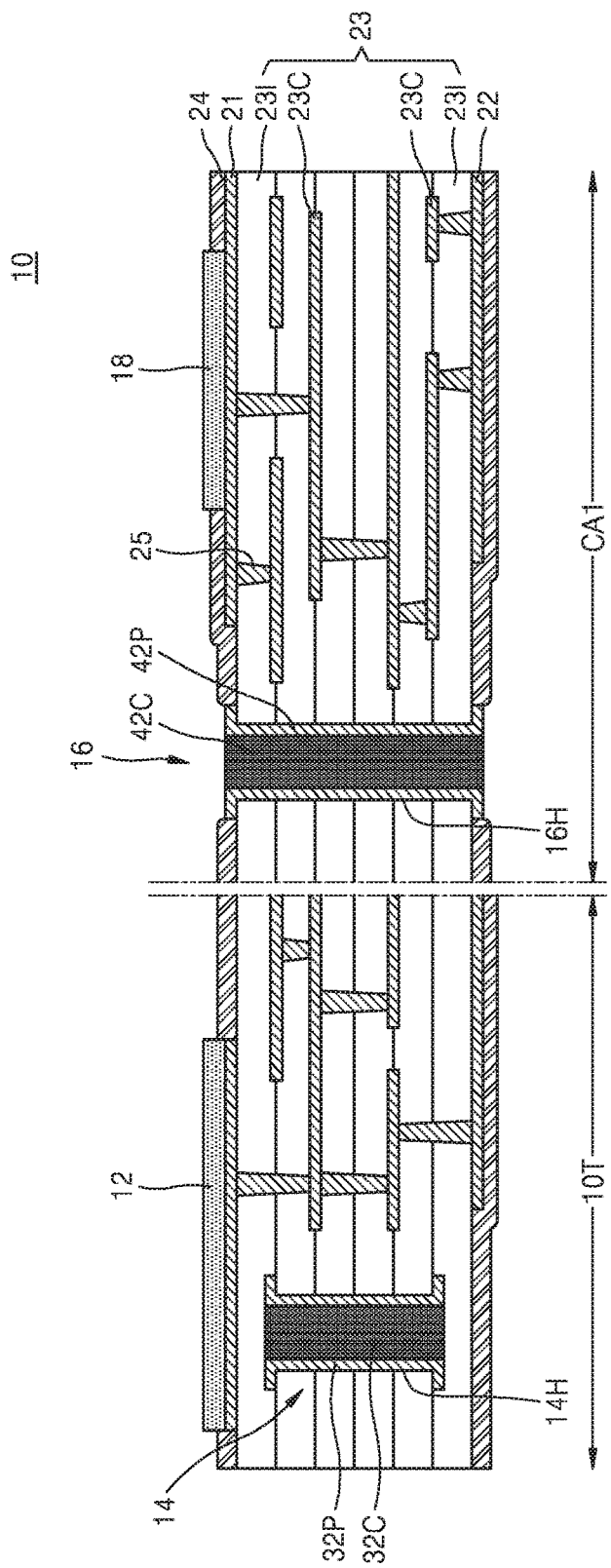
FIG. 3 is a cross-sectional view illustrating portions of a circuit substrate of FIG. 1 according to example embodiments.

FIG. 1 is a perspective view illustrating a semiconductor storage device according to example embodiments. FIG. 2 is an enlarged layout diagram illustrating a portion of a circuit substrate of FIG. 1 according to example embodiments. FIG. 3 is a cross-sectional view illustrating portions of a circuit substrate of FIG. 1 according to example embodiments.

Referring to FIG. 1, a semiconductor storage device 100 may include a circuit substrate 10, a first semiconductor chip 120, at least one second semiconductor chip 130 and a third semiconductor chip 140. In some embodiments, the circuit substrate 10 may be a printed circuit board (PCB). The first through third semiconductor chips 120, 130 and 140 may be mounted on the circuit substrate 10.

The circuit substrate 10 may include a main body 10M and a connection tab 10T integrally connected to a side of the main body 10M.

The first through third semiconductor chips 120, 130 and 140 may be mounted on the main body 10M. The main body 10M may include a wiring pattern, which is formed thereon, to electrically connect the first through third semiconductor chips 120, 130 and 140.

Figure 9:
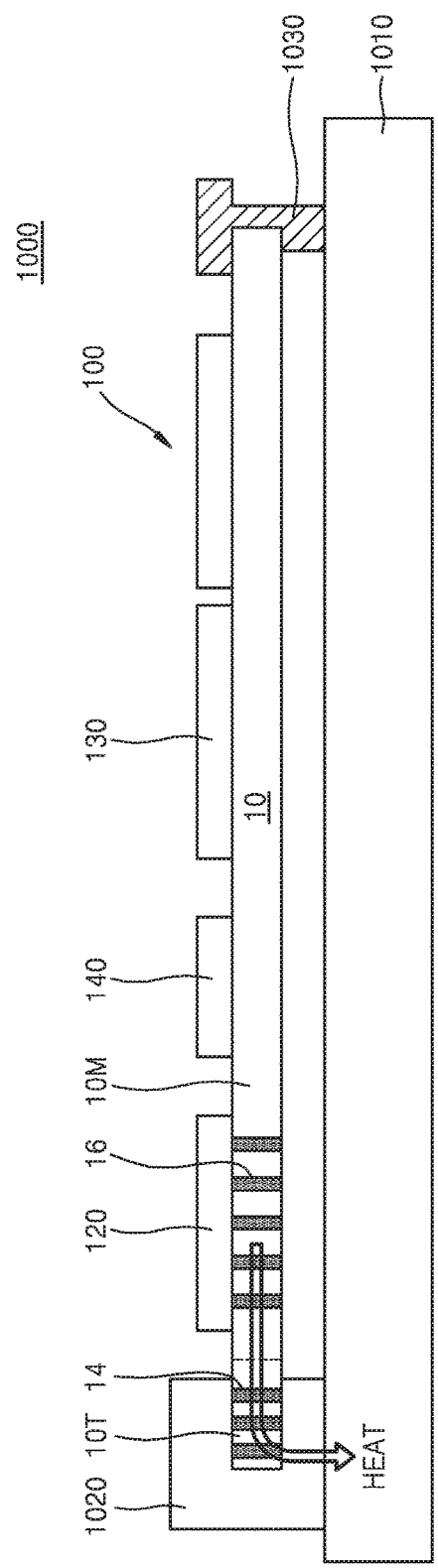
FIG. 9 is a cross-sectional view illustrating an electronic system including a semiconductor storage device according to example embodiments.

Referring briefly to FIG. 9, the semiconductor storage device 100 may be mounted on an electronic system 1000. The connection tab 10T may be a physical connection part, such as an electrical connection part, for mounting the semiconductor storage device 100 on a main board 1010 of the electronic system 1000. A connection pad 12 may be disposed on, connected to, attached to, or otherwise integrated with the connection tab 10T. Multiple connection pads 12 may be disposed on, connected to, attached to, or otherwise integrated with the connection tab 10T. An input/output signal (e.g., commands and data) may be received and transmitted from a host on the main board 1010 to the semiconductor storage device 100 (e.g., the first semiconductor chip 120, the second semiconductor chip 130 and/or the third semiconductor chip 140) through the connection pads 12. The connection pads 12 may be configured to be connected to an external device according to a parallel advanced technology attachment (PATA) standard, a serial advanced technology attachment (SATA) standard, a small computer system interface (SCSI) standard or a peripheral component interconnect express (PCIe) standard. Herein, the SATA standard may include not only SATA-1 but also all SATA-based standards, e.g., a SATA-2, a SATA-3, and an external SATA (e-SATA). The PCIe standard may include not only PCIe 1.0 but also all PCIe-based standards, e.g., PCIe 2.0, PCIe 3.0 and PCIe 4.0. The SCSI may include all SCSI-based standards, e.g., parallel SCSI, SA-SCSI (SAS), and iSCSI.

The circuit substrate 10, i.e., the main body 10M, may include a first chip mounting region CA1, a second chip mounting region CA2 and a third chip mounting region CA3. The first chip mounting region CA1 may be disposed closest to the connection tab 10T among the chip mounting regions CA1, CA2, CA3. The second chip mounting region CA2 may be spaced apart from the first chip mounting region CA1 and may be disposed further away from the connection tab 10T than the first chip mounting region CA1. For example, a first distance d1 between the first chip mounting region CA1 and the connection tab 10T may range from 100 μm to 5 mm. A second distance d2 between the second chip mounting region CA2 and the connection tab 10T may range from 5 mm to 60 mm. However, the example embodiments are not limited thereto.

The first chip mounting region CA1 and the second chip mounting region CA2 may be portions of the circuit substrate 10 on which the first semiconductor chip 120 and the second semiconductor chip 130 may be respectively mounted. The third chip mounting region CA3 may be a portion of the circuit substrate 10 on which the third semiconductor chip 140 may be mounted. The term "first chip mounted region CA1" may refer to a region including an upper surface of the circuit substrate 10 on which the first semiconductor chip 120 may be mounted and the inside of the circuit substrate 10 overlapping with the first semiconductor chip 120.

The first semiconductor chip 120 may be mounted on the first chip mounting region CA1. The first semiconductor chip 120 may be, e.g., a controller such as a processor or other type of device, component or circuit arrangement that processes logic. The first semiconductor chip 120 may read data stored in the second semiconductor chip 130 according to a read command received from the host, and may transmit the read data to the host. In embodiments described herein, the semiconductor storage device 100 may be physically separated from the host. In other embodiments described herein, the host may be provided on the main board 1010 of an electronic system 1000 that also includes the semiconductor storage device 100 as in FIG. 9. The first semiconductor chip 120 may store data received from the host in the second semiconductor chip 130 according to a write command received from the host. In some embodiments, the first semiconductor chip 120 may be connected to the host by PCIe interface and may exchange commands and data with the host. The first semiconductor chip 120 may perform wear leveling, garbage collection, bad block management and/or error correction code (ECC) for the second semiconductor chip 130.

The second semiconductor chip 130 may be mounted on the second chip mounting region CA2. The second semiconductor chip 130 may include a different type of device from the first semiconductor chip 120. For example, the first semiconductor chip 120 may be a controller such as a processor or other type of device, component or circuit arrangement that processes logic, and the second semiconductor chip 130 may be a non-volatile memory device that stores data and instructions. A non-volatile memory device may be, e.g., a NAND flash memory, a resistive random access memory (RRAM), a magnetoresistive RAM (MRAM), a phase change RAM (PRAM) or a ferroelectric RAM (FRAM), but is not limited thereto. The second semiconductor chip 130 may be electrically connected to the first semiconductor chip 120 through wiring patterns in and/or on the circuit substrate 10.

The third semiconductor chip 140 may be mounted on the third chip mounting region CA3. The third semiconductor chip 140 may be electrically connected to the first semiconductor chip 120 through the wiring patterns in and/or on the circuit substrate 10. The third semiconductor chip 140 may be, e.g., a buffer memory device. The third semiconductor chip 140 may act to increase data transmission efficiency between the first semiconductor chip 120 and the second semiconductor chip 130. For example, the third semiconductor chip 140 may be a dynamic random access memory (DRAM).

The semiconductor storage device 100 may further include an active device and/or a passive device. Examples of devices that may be included in a semiconductor storage device 100 include a chip resistor, a chip capacitor, an inductor, a switch, a temperature sensor, a DC-DC converter, a quartz crystal for generating a clock signal, or a voltage regulator.

Referring to FIGS. 1 and 2, a first thermal via 14 may be disposed in the connection tab 10T. The first thermal via(s) 14 may dissipate heat generated during operation of the first semiconductor chip 120 to the inside of the main board 1010 (refer to FIG. 9) through the connection tab 10T. The first thermal via(s) 14 may include a conductive material such as copper or aluminum.

In some embodiments, the first thermal via 14 may partially or completely pass through the connection tab 10T under the connection pads 12. This is shown in FIG. 3 as described below, where the first thermal via 14 passes most of the way (i.e., from top to bottom) in the connection tab 10T under the connection pads 12. As shown in FIG. 2, three first thermal vias 14 may be arranged to be spaced apart from each other with respect to each connection pad 12. However, the example embodiments of the inventive concepts are not limited thereto. The number of the first thermal via(s) 14 overlapping with each connection pad 12 may be variously selected from one, two, or four or more. In some embodiments, the first thermal via(s) 14 may be disposed at a portion of the connection tab 10T that does not overlap with each, or any, connection pad 12, different than what is shown in FIG. 2.

A second thermal via 16 may be disposed in the first chip mounting region CA1 in the main body 10M. The second thermal via 16 may dissipate heat generated during operation of the first semiconductor chip 120 to the inside of the main board 1010, through the first chip mounting area CA1 and/or the connection tab 10T.

In some embodiments, the second thermal via 16 may partially or completely pass through the main body 10M in the first chip mounting region CA1. This is shown in FIG. 3 as described below, where the second thermal via 16 passes most of the way (i.e., from top to bottom) in the main body 10M in the first chip mounting region CA1. The second thermal via 16 may include a conductive material such as copper or aluminum. As shown in FIG. 2, the second thermal via 16 may include multiple thermal vias arranged in a matrix array, but the arrangement of second thermal vias 16 is not limited thereto. The arrangement of the second thermal via 16 may be variously modified.

Multiple connection pins 18 may be arranged in a matrix array in the first chip mounting region CA1. The connection pins 18 may act as connection pads to connect the first semiconductor chip 120 to the circuit substrate 10 in a ball grid array (BGA) manner.

The connection pins 18 may have various arrangements or various shapes different from that shown in FIG. 2. The second thermal via 16 may include the multiple thermal vias arranged in a matrix array to be spaced a certain distance apart from the connection pins 18 to. The certain distance may be a predetermined distance, or a distance within a predetermined range or simply above or below a predetermined threshold.

In some embodiments, the second thermal via(s) 16 may be disposed not only in the first chip mounting region CA1 but also outside the first chip mounting CA1 to surround the first chip region CA1. In other embodiments, the second thermal via(s) 16 may be further disposed in a portion of the main body 10M between the first chip mounting region CA1 and the connection tab 10T.

Referring to FIG. 1, the first chip mounting region CA1 may be spaced the first distance d1 apart from the connection tab 10T in a first direction parallel to the upper surface of the circuit substrate 10. The second chip mounting region CA2 may be spaced the second distance d2 apart from the connection tab 10T in the first direction. The second distance d2 may be greater than the first distance d1. Heat generated during operation of the first semiconductor chip 120 on the first chip mounting region CA1 may be quickly transferred toward the main board 1010 (refer to FIG. 9) contacting the connection tab 10T, through the first thermal via(s) 14 in the connection tab 10T and the second thermal via(s) 16 in the first chip mounting region CA1. Thus, a temperature of the second semiconductor chip 130 or other areas or elements may be restrained from rising despite heat generated by the first semiconductor chip 120.

When the first semiconductor chip 120 includes a controller, and the second semiconductor chip 130 includes a non-volatile memory device, a relatively large amount of heat may be generated during operation of the controller. When the non-volatile memory is mounted adjacent to the controller, the heat generated from the controller may undesirably raise the temperature of the non-volatile memory device. The non-volatile memory device may incur unwanted data loss due to the undesirably raised temperature. To dissipate the heat generated from the controller to the outside of the semiconductor storage device, an additional heat dissipating member, such as a heat sink, a heat spreader, a heat dissipating case or a thermal interface material (TIM) may be attached on top and/or bottom of the circuit substrate 10. However, application of the additional heat dissipation member may be limited in tiny and ultrathin solid state drives.

In the semiconductor storage device 100 according to the above example embodiments, the first thermal via(s) 14 and the second thermal via(s) 16 may be respectively disposed in the connection tab 10T and the first chip mounting region CA1, and thus the heat generated during the operation of the first semiconductor chip 120 mounted on the first chip mounting region CA1 may be dissipated to the main board 1010 (refer to FIG. 9) through the connection tab 10T and through the first chip mounting area CA1. As the heat is dissipated to the main board 1010 having a relatively large area, the temperature of the first semiconductor chip 120 and also the temperature of the second semiconductor chip 130 may be prevented from rising somewhat or entirely. Thus, the data loss due to the heat generation of the semiconductor storage device 100 may be reduced or prevented, and the semiconductor storage device 100 may have an improved reliability.

Additionally, with the first thermal via(s) 14 and/or the second thermal via(s) 16, the semiconductor storage device 100 may have an improved heat dissipation property without requiring an additional heat dissipation member attached on the top or bottom of the circuit substrate 10. Accordingly, the semiconductor storage device 100 may have a compact size.

Referring to FIGS. 1 and 3, the circuit substrate 10 of the semiconductor storage device 100 may include a first outer layer 21, a second outer layer 22 and an inner stack 23 between the first outer layer 21 and the second outer layer 22.

In some embodiments, the inner stack 23 may be formed in such a way that inner conductive layers 23C and inner insulating layers 23I are alternately stacked on each other. The inner conductive layers 23C may include a ground layer serving as a reference of potential of another layer and a signal layer for transmitting a signal between the devices on the circuit substrate 10. For example, the inner insulating layers 23I may insulate the inner conductive layers 23C, and may be formed between each inner conductive layer 23C.

A solder resist layer 24 may be formed on the first and second outer layers 21 and 22. A via 25 may penetrate the inner insulating layers 23I to connect adjacent inner conductive layers 23C to each other.

In some embodiments, the first outer layer 21, the second outer layer 22, the inner conductive layers 23C and the via 25 may include a high thermal conductive material, e.g., copper, nickel, stainless steel and/or beryllium copper. In some embodiments, the inner insulating layers 23I may include phenolic resin, epoxy resin and/or polyimide. For example, the inner insulating layers 23I may include bismaleimide triazine (BT) resin, frame retardant 4 (FR4), polyester, tetrafunctional epoxy, polyphenylene ether, and/or epoxy/polyphenylene oxide.

The connection pin 18 may be disposed on the first outer layer 21 in the first chip mounting region CA1. The first semiconductor chip 120 may be mounted on the connection pin 18 in a ball grid array manner. In other embodiments, an additional connection pin may be further disposed on the second outer layer 22, and an additional semiconductor chip may be mounted on the additional connection pin. In this case, the circuit substrate may have a structure in which the semiconductor chip 120 et al. are mounted on opposite surfaces thereof. Additionally, the passive devices or the active devices may be further mounted on the first outer layer 21 and the second outer layer 22, and/or in the inner stack 23.

The connection pad(s) 12 may be disposed on the first outer layer 21 in the connection tab 10T. The connection pad(s) 12 may transmit power, or commands or data from the host, to the first semiconductor chip 120 through the first outer layer 21 and the via 25.

The first thermal via(s) 14 may include a first core pillar 32C at least partially penetrating the inner stack 23, and a first via metal layer 32P surrounding a sidewall of the first core pillar 32C. In some embodiments, the first via metal layer 32P may be formed to conform to an inner surface of a first through via hole 14H that at least partially penetrates the inner stack 23, and the first core pillar 32C may fill the first through via hole 14H.

In some embodiments, the first via metal layer 32P may include a copper layer formed by a plating process. The first core pillar 32C may be formed by filling the first through via hole 14H with a copper paste or a hole plug ink including conductive particles such as copper. However, a material for the first via metal layer 32P and the first core pillar 32C is not limited thereto.

The first thermal via(s) 14 may completely penetrate the inner stack 23 except an uppermost inner insulating layer 23I contacting the first outer layer 21 and a lowermost inner insulating layer 23I contacting the second outer layer 22. The second thermal via 16 may partially or completely penetrate the first outer layer 21 and the second outer layer 22, as well as the entirety of the inner stack 23. The second thermal via 16 may include a second core pillar 42C penetrating the first and second outer layers 21 and 22 and the inner stack 23, and a second via metal layer 42P surrounding a sidewall of the second core pillar 42C. The second via metal layer 42P may be formed to conform to an inner surface of a second through via hole 16H that partially or completely penetrates the first and second outer layers 21 and 22, as well as the entirety of the inner stack 23. The second core pillar 42C may fill the second through via hole 16H.

In some embodiments, the second via metal layer 42P may include a copper layer formed by a plating process. The second core pillar 42C may be formed by filling the second through via hole 16H with a copper paste or a hole plug ink including conductive particles such as copper. However, a material for the second via metal layer 42P and the second core pillar 42C is not limited thereto.

In some embodiments, the first and second thermal vias 14 and 16 may be connected to the ground layer of the inner conductive layers 23C. Thus, heat generated from the first semiconductor chip 120 may be quickly transferred to the ground layer through the first and second thermal vias 14 and 16. Thus, the heat may spread over the entire circuit substrate 10 through the ground layer and may be absorbed. In other embodiments, at least one of the first and second thermal vias 14 and 16 may be connected to the signal layer of the inner conductive layers 23C or may not be connected to the ground layer or the signal layer.

Since the first and second thermal vias 14 and 16 include the high thermal conductive material, the first and second thermal vias 14 and 16 may have an improved heat dissipation property.

The first thermal via(s) 14 under any connection pad 12 may not directly contact the connection pad 12. The first through via hole 14H may not penetrate the uppermost inner insulating layer 23I contacting the first outer layer 21, and may not be exposed to the outside of the circuit substrate 10. Accordingly, when the connection pad(s) 12 are formed on the first core pillar 32C (e.g., when the connection pad(s) 12 are in direct contact with the first core pillar 32C), a recess or groove may not be formed on a surface of the connection pad(s) 12.

Figure 4:
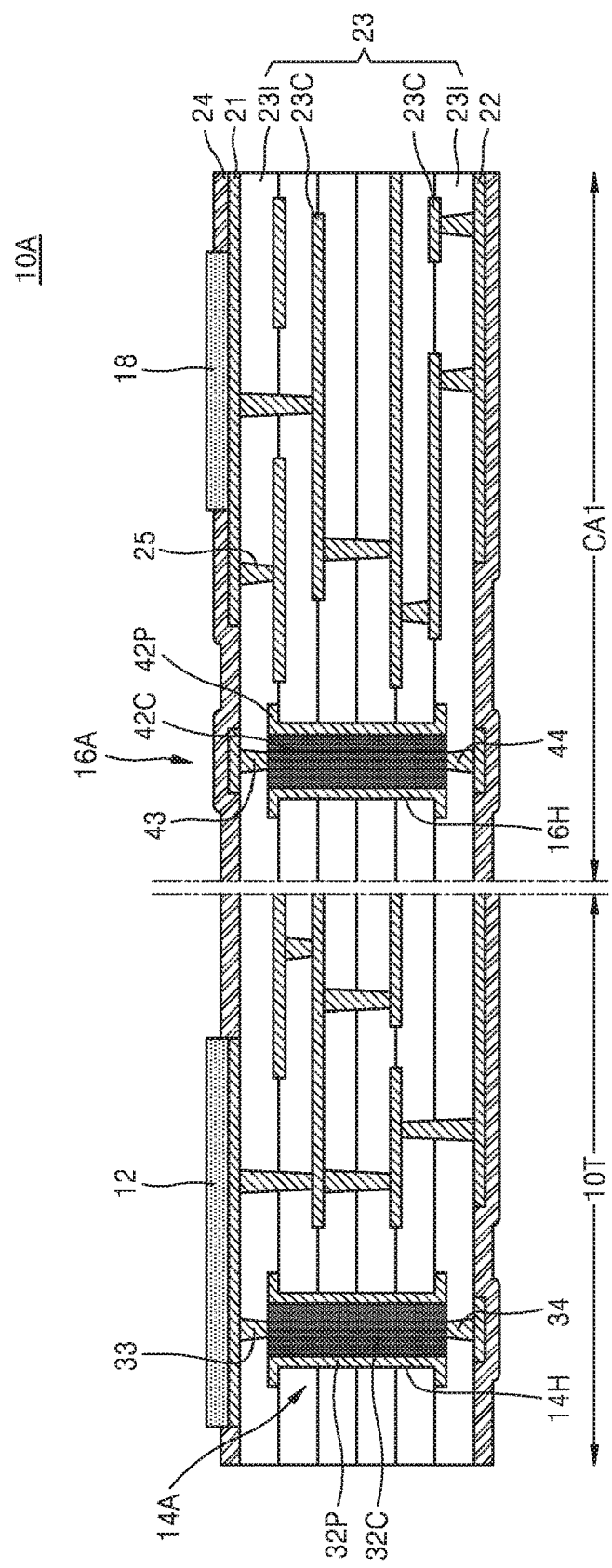
FIG. 4 is a cross-sectional view illustrating portions of a circuit substrate according to example embodiments.

FIG. 4 is a cross-sectional view illustrating portions of a circuit substrate according to example embodiments. In FIG. 4, a circuit substrate 10A may be similar to the circuit substrate 10 described with reference to FIG. 3, except for structures of a first thermal via 14A and a second thermal via 16A. The same reference numerals are used to denote the same elements as in FIGS. 1 to 3.

Referring to FIG. 4, the first thermal via(s) 14A may include the first core pillar 32C penetrating the inner stack 23, the first via metal layer 32P surrounding the sidewall of the first core pillar 32C, a first outer via 33 penetrating the first outer layer 21 and connected to the first core pillar 32C, and a second outer via 34 penetrating the second outer layer 22 and connected to the first core pillar 32C. The first and second outer vias 33 and 34 may include copper or aluminum. The first outer via 33 of the first thermal via(s) 14A may overlap the corresponding connection pad 12 and may be electrically connected to the connection pad 12.

The second thermal via 16A may include the second core pillar 42C penetrating the inner stack 23. The second via metal layer 42P may surround the sidewall of the second core pillar 42C. A third outer via 43 may penetrate the first outer layer 21 and is connected to the second core pillar 42C. A fourth outer via 44 may penetrate the second outer layer 22 and may be connected to the second core pillar 42C.

The number of the inner insulating layers 23I and the inner conductive layers 23C in the inner stack 23 may be variously modified to be different from that shown in FIG. 4. In this case, the first thermal via(s) 14A may include, e.g., the first core pillar 32C and two or more layered first outer vias 33 sequentially connected to the first core pillar 32C, and two or more layered second outer vias 34 sequentially connected to the first core pillar 32C.

In some embodiments, in the process for forming the first thermal via(s) 14A and the second thermal via 16A, an insulating material such as FR4 resin and a conductive material such as copper foil may be thermally bonded to form an intermediate structure in which multiple inner insulating layers 23I and multiple inner conductive layers 23C are laminated. A drilling process may be performed on the intermediate structure to form the first through via hole 14H and the second through via hole 16H. The first and second via metal layers 32P and 42P may be formed on the inner surfaces of the first and second through via holes 14H and 16H, respectively, by an electroless plating process or an electrolytic plating process. A hole plug ink, a copper paste or a copper-alloy paste may be filled in the first and second through via holes 14H and 16H respectively having first and second via metal layers 32P and 42P to form the first and second core pillars 32C and 42C. A polishing process and a plating process may be selectively performed on the intermediate structure having the first and second core pillars 32C and 42C to further form a copper surface layer on upper surfaces of the first and second core pillars 32C and 42C.

One of the inner insulating layers 23I and the first outer layer 21 may be formed on an upper surface of the intermediate structure having the first and second core pillars 32C and 42C, and then an outer via hole exposing the upper surfaces of the first and second core pillars 32C and 42C may be formed by a laser drilling process such as a laser ablation or a UV laser process. The outer via hole may be filled by a plating process to form the first and third outer vias 33 and 43.

One of the inner insulating layers 23I and the second outer layer 22 may be formed on a lower surface of the intermediate structure having the first and second core pillars 32C and 42C, and then an outer via hole exposing lower surfaces of the first and second core pillars 32C and 42C may be formed by a laser drilling process. The outer via hole may be filled by a plating process to form the second and fourth outer vias 34 and 44.

Figure 5:
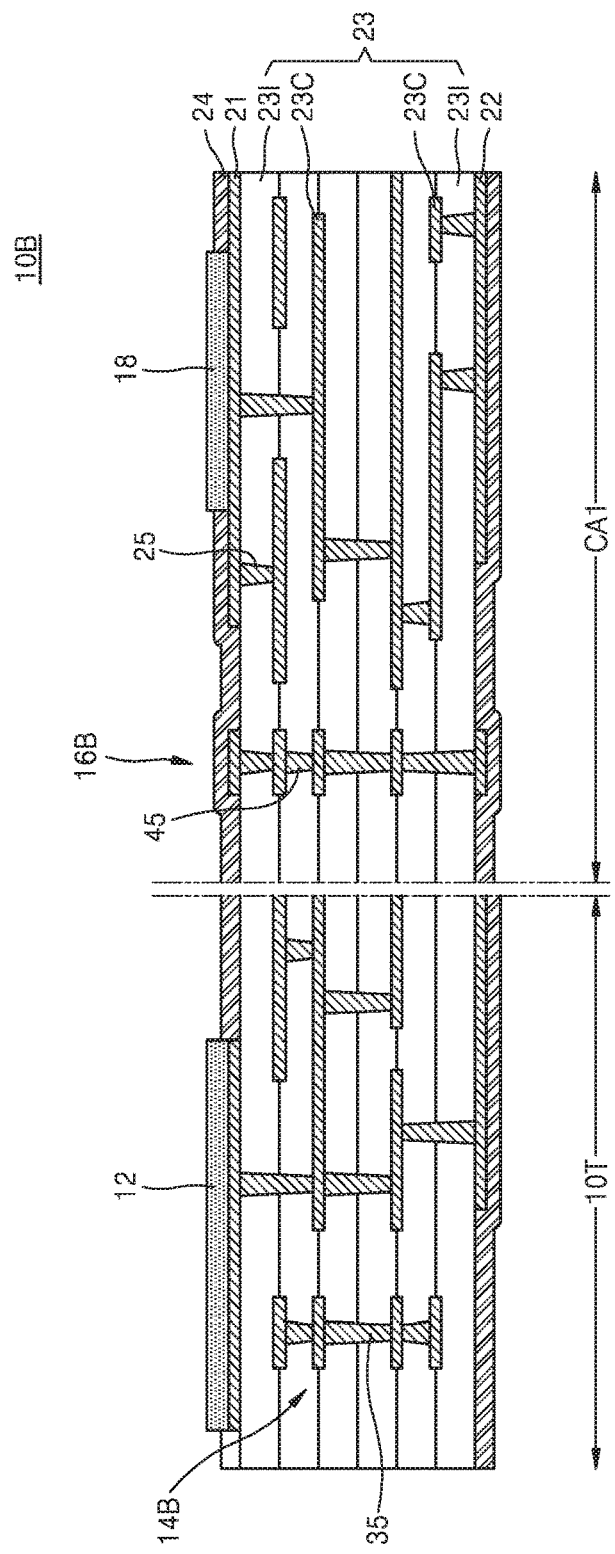
FIG. 5 is a cross-sectional view illustrating portions of a circuit substrate according to example embodiments.

FIG. 5 is a cross-sectional view illustrating portions of a circuit substrate according to example embodiments. In FIG. 5, a circuit substrate 10B may be similar to the circuit substrate 10 described with reference to FIG. 3, except for structures of a first thermal via 14B and a second thermal via 16B. The same reference numerals are used to denote the same elements as in FIGS. 1 to 4

Referring to FIG. 5, the first thermal via(s) 14B may include multiple conductive vias 35 which collectively penetrate each layer of the inner stack 23 and are connected to each other. The second thermal via 16B may include multiple conductive vias 45 which collectively penetrate each layer of the inner stack 23 and are connected to each other.

In some embodiments, the first thermal via(s) 14B may be disposed to overlap the corresponding connection pad(s) 12. The first thermal via(s) 14B may not penetrate the first outer layer 21 and may not directly contact the connection pad(s) 12. In some embodiments, the first thermal via(s) 14B may penetrate the first outer layer 21 and the uppermost inner insulating layer 23I and may be electrically connected to the connection pad 12.

In the example process for forming the multiple conductive vias 35 and 45, an intermediate structure may be formed in such a way which at least one inner insulating layer 23I and at least one inner conductive layer 23C are laminated. After forming a conductive via hole in the intermediate structure by a laser drilling process, the conductive via hole may be filled by a plating process to form first conductive vias 35 and 45. At least one inner insulating layer 23I and at least one inner conductive layer 23C may be laminated on an upper surface or lower surface of the intermediate structure, and then a conductive via hole exposing upper surfaces of the first conductive vias 35 and 45 may be formed. The conductive via hole may be filled by the plating process to form second conductive vias 35 and 45 connected to the first conductive vias 35 and 45. Such processes may be repeated several times to form the multiple conductive vias 35 and 45 at least partially penetrating the inner stack 23.

Although the circuit substrates 10, 10A and 10B respectively having the first thermal vias 14, 14A and 14B and the second thermal vias 16, 16A and 16B are described with reference to FIGS. 3 to 5, other embodiments may include various combinations of the first thermal via and the second thermal via. For example, the circuit substrates 10, 10A and 10B may include the first thermal via(s) 14 described in FIG. 3 and the second thermal via(s) 16B described in FIG. 5, in the connection tab 10T and the first chip mounting region CA1. The number of the inner insulating layers 23I and the inner conductive layers 23C may be variously modified to be different from those shown in FIGS. 3 to 5.

Figure 6:
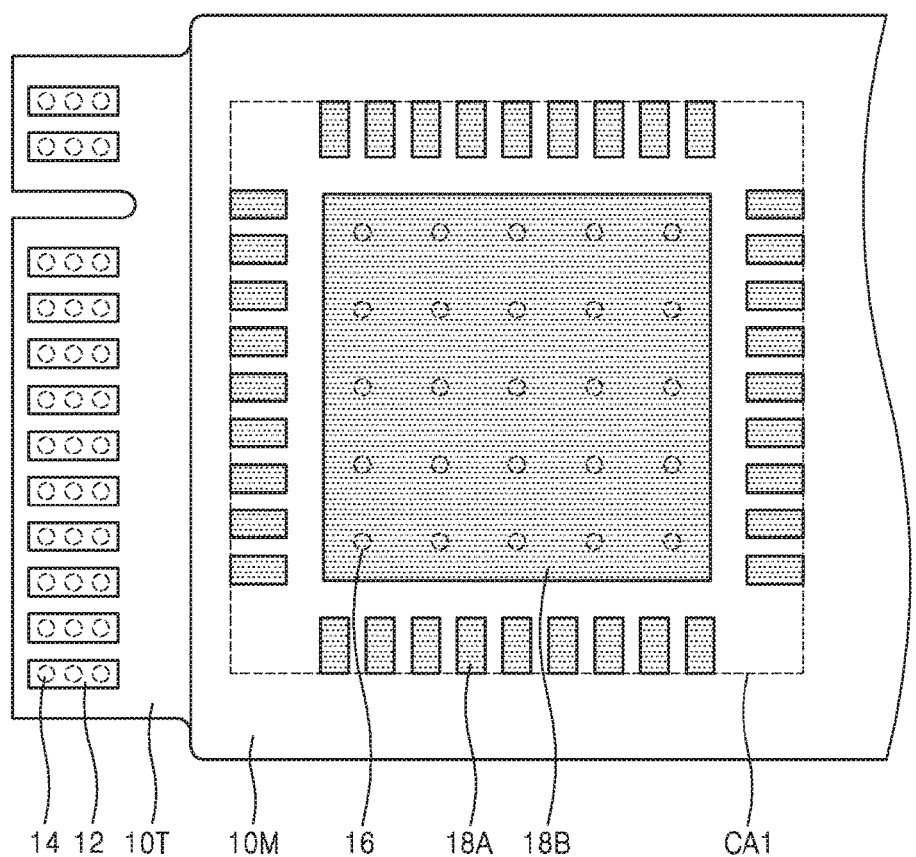
FIG. 6 is an enlarged layout diagram illustrating a portion of a circuit substrate according to example embodiments.

FIG. 6 is an enlarged layout diagram illustrating a portion of a circuit substrate according to example embodiments. The same reference numerals are used to denote the same elements as in FIGS. 1 to 5.

Referring to FIG. 6, the first semiconductor chip 120 (refer to FIG. 1) may be mounted in a quad flat non-lead manner in the first chip mounting region CA1. Multiple pads 18A may be disposed along fourth sides of the first chip mounting region CA1 at a predetermined interval. A thermal pad 18B may be disposed at a central portion of the first chip mounting region CA1.

The second thermal via 16 may be disposed to overlap the thermal pad 18B in the first chip mounting region CA1. For example, the second thermal via 16 may include multiple thermal vias arranged in a matrix array in the first chip mounting region CA1, but the second thermal via 16 is not limited thereto.

In some embodiments, the second thermal via 16 may include the second core pillar 42C penetrating the circuit substrate 10 and the second via metal layer 42P surrounding the second core pillar 42C as described in FIG. 3. The second thermal via 16 and the thermal pad 18B may be formed to be in contact with each other. The heat generated during operation of the first semiconductor chip 120 may be more quickly discharged toward the main board 1010 (refer to FIG. 9) through the thermal pad 18B and the second thermal via 16.

Figure 7:
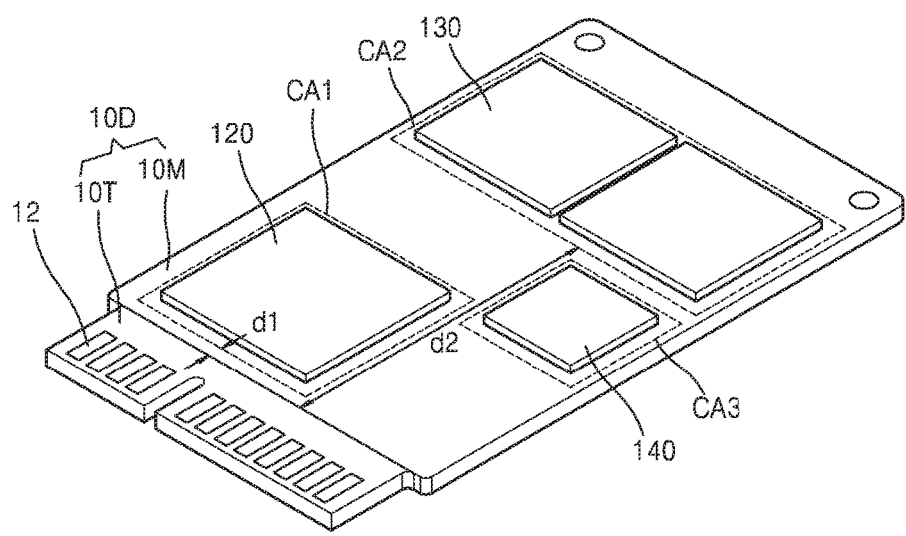
FIG. 7 is a perspective view illustrating a semiconductor storage device according to example embodiments.

FIG. 7 is a perspective view illustrating a semiconductor storage device according to example embodiments. The same reference numerals are used to denote the same elements as in FIGS. 1 to 6.

Referring to FIG. 7, a circuit substrate 10D may include the main body 10M and the connection tab 10T disposed on a side of the main body 10M. A semiconductor storage device 100A may include the first semiconductor chip 120, one or more the second semiconductor chips 130, and the third semiconductor chip 140 that are mounted on the circuit substrate 10D. The first semiconductor chip 120 may be, e.g., a controller, and the second semiconductor chip 130 may be, e.g., a flash memory, a phase change memory or a resistive memory. The third semiconductor chip 140 may be a DRAM.

In some embodiments, the second semiconductor chip 130 may be further mounted on a back surface of the circuit substrate 10D, i.e., a surface opposed to the front surface of the circuit substrate 10D on which the first semiconductor chip 120 is mounted.

In some embodiments, the semiconductor storage device 100A may be a solid state drive of a type in which an external case or an additional heat dissipating structure is not attached on the circuit substrate 10D, such that the overall outer surface of the circuit substrate 10D is substantially exposed (i.e., open) where semiconductor chips 120, 130, 140 are not mounted. In other embodiments, the semiconductor storage device 100A may include an external case covering the circuit substrate 10D or an additional heat dissipating structure.

Figure 8:
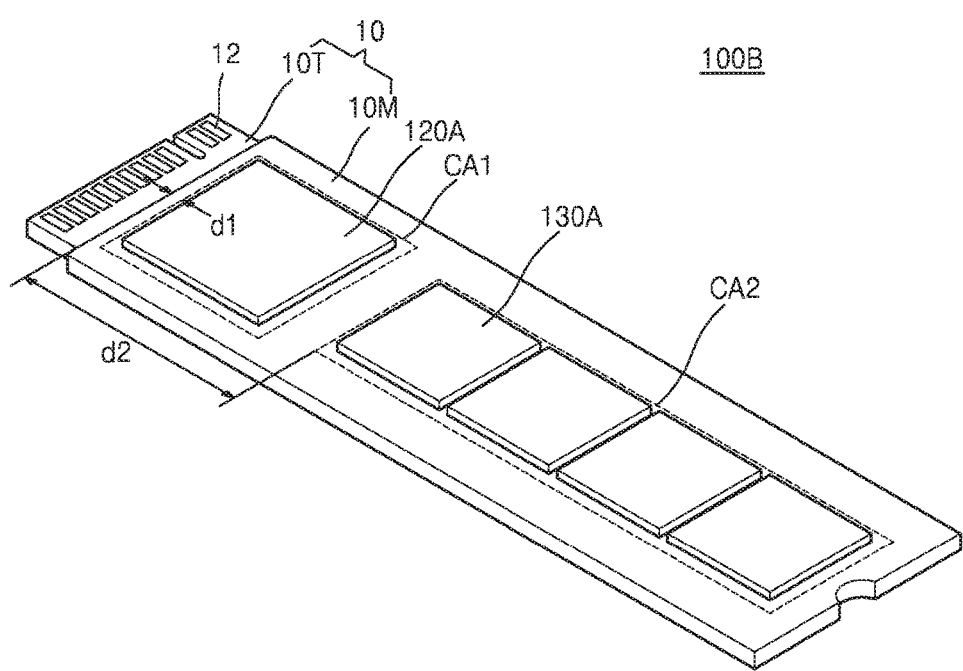
FIG. 8 is a perspective view illustrating a semiconductor storage device according to example embodiments.

FIG. 8 is a perspective view illustrating a semiconductor storage device according to example embodiments. The same reference numerals are used to denote the same elements as in FIGS. 1 to 7.

Referring to FIG. 8, a semiconductor storage device 100B may include a first semiconductor chip 120A and at least one second semiconductor chip 130A that are mounted on the circuit substrate 10.

In some embodiments, the semiconductor storage device 100B may be a memory module. The first semiconductor chip 120A may be a memory controller, and the second semiconductor chip(s) 130A may be one or more memory devices such as DRAMs. The first semiconductor chip 120A may read data stored in the second semiconductor chip(s) 130A according to a read command received from the host and may transmit the read data to the host. The first semiconductor chip 120A may also store data transmitted from the host in the second semiconductor chip(s) 130A according to a write command received from the host. In some embodiments, a buffer memory device may be further disposed on the circuit substrate 10 to increase data transmitting efficiency between the first semiconductor chip 120A and the second semiconductor chip(s) 130A.

In other embodiments, the semiconductor storage device 100B may be a solid state drive, the first semiconductor chip 120A may be, e.g., a controller, and the second semiconductor chip(s) 130A may each be, e.g., a flash memory, a phase change memory or a resistive memory. Additionally, a buffer memory device may be further disposed on the circuit substrate 10 to increase data transmitting efficiency between the first semiconductor chip 120A and the second semiconductor chip 130A.

FIG. 9 is a cross-sectional view illustrating an electronic system including a semiconductor storage device according to example embodiments.

Referring to FIG. 9, an electronic system 1000 may include the main board 1010, a connection member 1020 attached to the main board 1010, and a fixing member 1030 capable of attaching the semiconductor storage device 100 to the main board 1010.

The semiconductor storage device 100 may include a main body 10M and a connection tab 10T. The connection tab 10T may be disposed on the main board 1010 to be accommodated in a groove of the connection member 1020 and may be fixed by the fixing member 1030.

An external system such as a host processor may be disposed on the main board 1010. By the external system, the first semiconductor chip 120 of the semiconductor storage device 100 may receive commands or data, and data may be transmitted from the first semiconductor chip 120.

For example, the first semiconductor chip 120 may be a controller. In operation of the first semiconductor chip 120, a relatively large amount of heat may be generated to thereby raise the temperature of the first semiconductor chip 120. The heat may also raise the temperature of the adjacent second semiconductor chip 130 in the absence of the first and second thermal vias 14 and 16 described herein. The first and second thermal vias 14 and 16 may be disposed in the connection tab 10T of the circuit substrate 10 and/or in a portion of the circuit substrate 10 overlapping with the first semiconductor chip 120, and may include, e.g., a high thermal conductive material such as copper or aluminum. Thus, the heat generated from the first semiconductor chip 120 may be quickly discharged toward the main board 1010, partly or fully through the connection member 1020, by the first and second thermal vias 14 and 16. The discharge of heat from the first semiconductor chip 120 toward the main board 1010 may be schematically illustrated by an arrow in FIG. 9. In addition to the direction schematically illustrated by the arrow in FIG. 9, heat may also be channeled or otherwise discharged downward by, e.g., the second thermal vias 16, away from the first semiconductor chip 120 and away from the second semiconductor chip 130. The heat generated during operation of the first semiconductor chip 120 may be dissipated to the main board 1010 having a relatively large area, and the main board 1010 may act as a heat sink. Thus, an unwanted temperature rise of the second semiconductor chip 130 due to the heat generated from the first semiconductor chip 120 may be reduced or prevented. As a result, data loss of the second semiconductor chip 130 may also be reduced or prevented. Additionally, other passive devices or active devices that are susceptible to heat and mounted on the circuit substrate 10 may be prevented from deteriorating in reliability due to the heat from the first semiconductor chip 120. When an additional heat dissipating structure outside the circuit substrate 10 is not formed, the circuit substrate 10 may have a reduced size.

Figure 10:
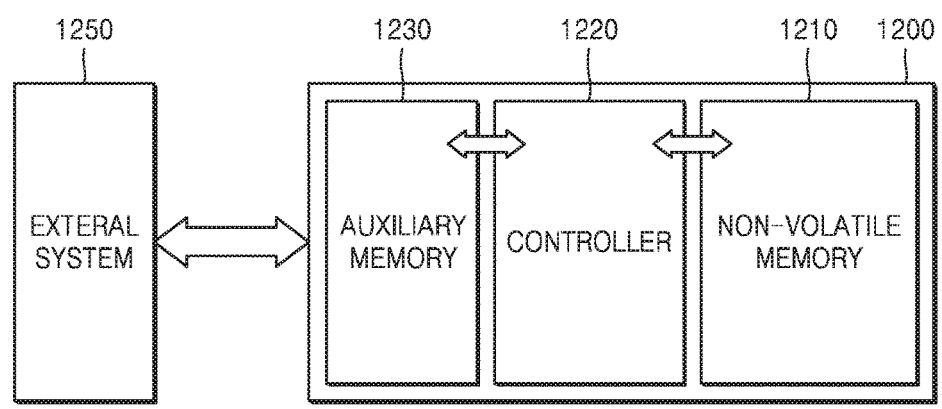
FIG. 10 is a block diagram illustrating an electronic system including a semiconductor storage device according to example embodiments.

FIG. 10 is a block diagram illustrating an electronic system including a semiconductor storage device according to example embodiments.

Referring to FIG. 10, data inputted from an external system 1250 may be stored in an electronic system 1200. The electronic system 1200 may include a non-volatile memory 1210, a controller 1220 and an auxiliary memory 1230. The electronic system 1200 may be any one of the semiconductor storage devices 100, 100A and 100B described with reference to FIGS. 1 to 9.

The data inputted from the external system 1250 may be stored in the non-volatile memory 1210 via the auxiliary memory 1230 and the controller 1220. The controller 1220 may read data from the non-volatile memory 1210 through the auxiliary memory and may transmit the read data to the external system 1250.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A semiconductor storage device, comprising:
a circuit substrate that includes a main body and a connection tab integrally connected to an edge of a side of the main body for mounting the circuit substrate to an electronic system without directly mounting the main body to the electronic system, the main body including a first chip mounting region and a second chip mounting region;
a first semiconductor chip of a first type mounted on the first chip mounting region; and
a second semiconductor chip of a second type mounted on the second chip mounting region, the second type of the second semiconductor chip being different from the first type of the first semiconductor chip,
wherein the circuit substrate further includes a first thermal via in the connection tab and comprising a conductive material.

2. The device according to claim 1,
wherein the connection tab is connected on one and only one side of the main body,
wherein a connection pad is disposed on the connection tab,
the connection pad is configured to transmit an input/output signal to the first semiconductor chip or the second semiconductor chip, and
the first thermal via overlaps with the connection pad.

3. The device according to claim 1, wherein the circuit substrate further includes:
a first outer layer;
a second outer layer opposed to the first outer layer; and
an inner stack between the first outer layer and the second outer layer,
and
wherein the first thermal via includes a first core pillar at least partially penetrating the inner stack.

4. The device according to claim 3, wherein the first thermal via further includes:
a first outer via penetrating the first outer layer and connected to the first core pillar; and
a second outer via penetrating the second outer layer and connected to the first core pillar.

5. The device according to claim 3, wherein the first thermal via includes a plurality of conductive vias which penetrate the first outer layer, the inner stack and the second outer layer and are electrically connected each other.

6. The device according to claim 1,
wherein the connection tab is one and only one connection tab connected to the main body,
wherein the circuit substrate further includes a second thermal via in the first chip mounting region in the main body.

7. The device according to claim 6, wherein the circuit substrate further includes:
a first outer layer;
a second outer layer opposed to the first outer layer; and
an inner stack between the first outer layer and the second outer layer,
and
wherein the second thermal via includes a second core pillar at least partially penetrating the inner stack.

8. The device according to claim 7, wherein the second core pillar penetrates the first outer layer, the inner stack and the second outer layer.

9. The device according to claim 7, wherein the second thermal via further includes:
a third outer via penetrating the first outer layer and connected to the second core pillar; and
a fourth outer via penetrating the second outer layer and connected to the second core pillar.

10. The device according to claim 6, wherein the circuit substrate further includes a plurality of connection pins on the first chip mounting region,
the first semiconductor chip is mounted on the connection pins in a ball grid array manner, and
the second thermal via spaced apart from the connection pins in the first chip mounting region.

11. The device according to claim 1, wherein a distance between the connection tab and the first chip mounting region is less than a distance between the connection tab and the second chip mounting region.

12. A semiconductor storage device, comprising:
a circuit substrate that includes a main body and a connection tab integrally connected to an edge of side of the main body for mounting the circuit substrate to an electronic system without directly mounting the main body to the electronic system;
a controller on the main body; and
a memory device on the main body, the memory device being further away from the connection tab than the controller,
wherein the circuit substrate further includes a first thermal via in the connection tab and a second thermal via in a portion of the main body overlapping the controller.

13. The device according to claim 12, wherein the circuit substrate further includes:
a first outer layer;
a second outer layer opposed to the first outer layer; and
an inner stack between the first outer layer and the second outer layer,
and
wherein the first thermal via and the second thermal via penetrate the inner stack.

14. The device according to claim 12, further comprising:
a connection pad on the connection tab,
wherein the first thermal via overlaps with the connection pad.

15. The device according to claim 12,
wherein the first thermal via and the second thermal via include a conductive material.

16. A semiconductor storage device, comprising:
a connection tab that includes a first thermal via comprising a conductive material and that is configured to directly mount the semiconductor storage device to an electronic system; and
a main body integrally connected on a single side at an edge the connection tab and including a first chip mounting region and a second chip mounting region;
wherein the first thermal via is configured to dissipate heat from a first semiconductor chip of a first type mounted on the first chip mounting region of the main body, and
the first thermal via is configured to channel heat from the first semiconductor chip away from a second semiconductor chip of a second type mounted on the second chip mounting region.

17. The device according to claim 16, further comprising:
a connection pad disposed on the connection tab and configured to transmit a signal to at least one of the first semiconductor chip and the second semiconductor chip,
wherein the first thermal via overlaps with the connection pad.

18. The device according to claim 16,
wherein the connection tab and the main body are elements of a circuit substrate, and
the first thermal via at least partially penetrates an inner stack of the circuit substrate provided between a first outer layer and a second outer layer opposite the first outer layer.

19. The device according to claim 16,
wherein the connection tab and the main body are elements of a circuit substrate, and
the circuit substrate further includes a second thermal via in the first chip mounting region in the main body.

20. The device according to claim 16, wherein a distance between the connection tab and the first chip mounting region is less than a distance between the connection tab and the second chip mounting region.

* * * * *